United States Patent
Hartzell

(10) Patent No.: US 7,682,948 B2
(45) Date of Patent: Mar. 23, 2010

(54) DIGITAL LIGHT VALVE

(75) Inventor: John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 867 days.

(21) Appl. No.: 11/483,431

(22) Filed: Jul. 10, 2006

(65) Prior Publication Data

US 2006/0252237 A1  Nov. 9, 2006

Related U.S. Application Data

(62) Division of application No. 10/955,159, filed on Sep. 29, 2004, now Pat. No. 7,078,323.

(51) Int. Cl.
*H01L 21/20* (2006.01)
(52) U.S. Cl. .................. 438/487; 347/224
(58) Field of Classification Search ............... 438/166, 438/308, 487, 22; 347/225–265
See application file for complete search history.

(56) References Cited

U.S. PATENT DOCUMENTS

2004/0259296 A1 * 12/2004 Voutsas et al. .............. 438/166
2005/0191100 A1 *  9/2005 Ooshima et al. ............ 399/370

* cited by examiner

*Primary Examiner*—Brook Kebede
*Assistant Examiner*—Tony Tran
(74) *Attorney, Agent, or Firm*—Law Office of Gerald Maliszewski; Gerald Maliszewski

(57) ABSTRACT

A system and method are provided for crystallizing a semiconductor film using a digital light valve. The method comprises: enabling pixel elements from an array of selectable pixel elements; in response to enabling the pixel elements, gating a light; sequentially exposing adjacent areas of a semiconductor film, such as Si, to the gated light; annealing the light-exposed areas of semiconductor film; and, in response to the annealing, laterally growing crystal grains in the semiconductor film. For example, the method may sequentially expose adjacent areas of semiconductor film to gated light in a first direction; and, simultaneously exposing adjacent areas of semiconductor film to gated light in a second direction, different than the first direction. For example, the second direction may be perpendicular to the first direction. As a result, crystal grains can be laterally grown simultaneously in the first and second directions.

11 Claims, 11 Drawing Sheets

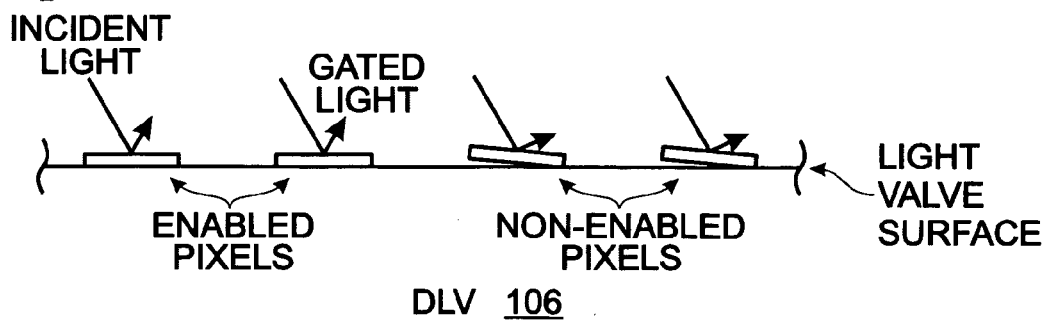
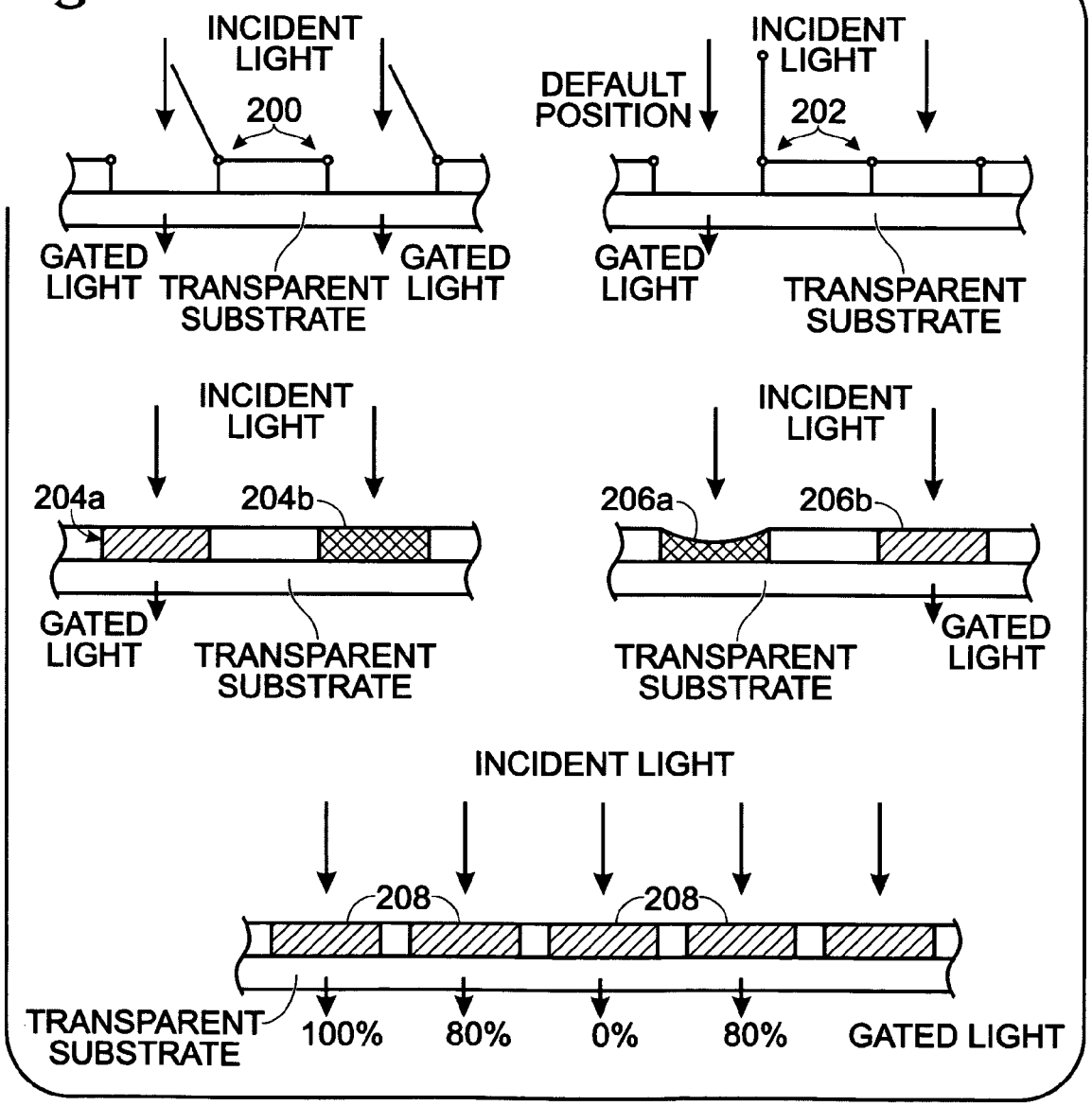

SEMICONDUCTOR FILM 402

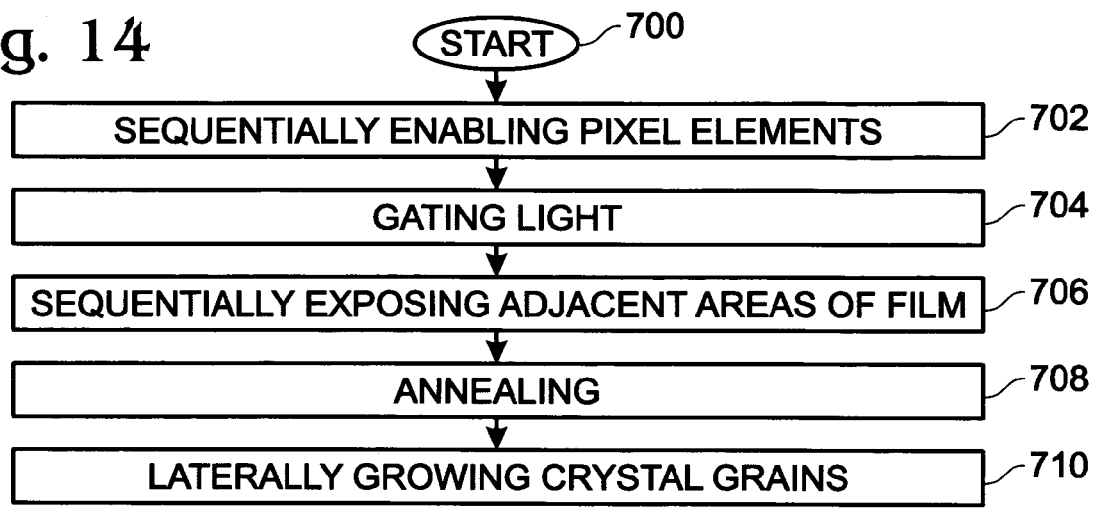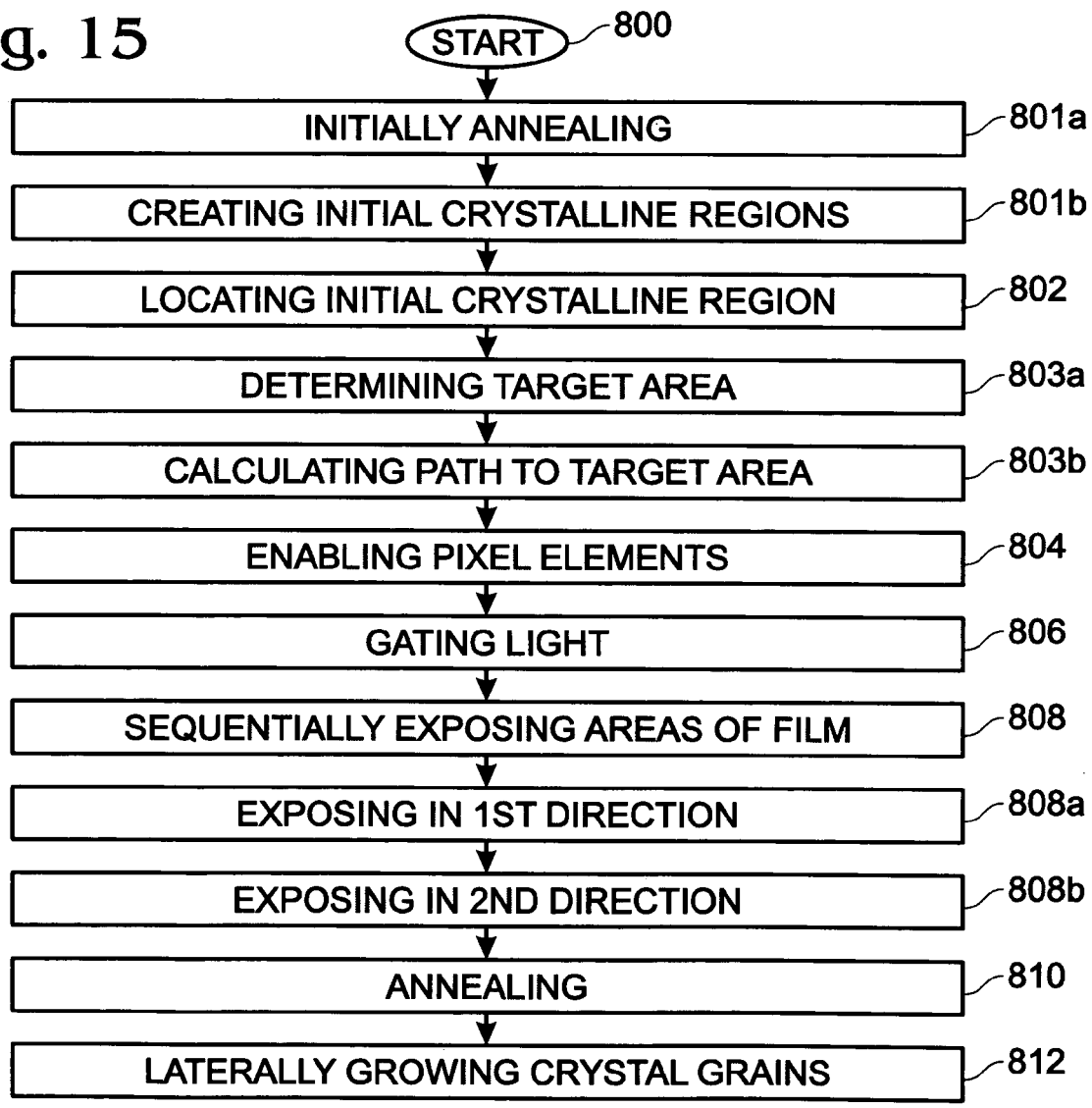

Fig. 18B

|       |       |       |       |
|-------|-------|-------|-------|
| $X_2$ | $X_2$ | $X_2$ | $X_2$ |
| $X_2$ | $X_1$ | $X_1$ | $X_2$ |
| $X_2$ | $X_1$ | $X_1$ | $X_2$ |
| $X_2$ | $X_2$ | $X_2$ | $X_2$ |

DIGITAL LIGHT VALVE

RELATED APPLICATIONS

This application is a Divisional application of a patent application Ser. No. 10/955,159 entitled, DIGITAL LIGHT VALVE SEMICONDUCTOR PROCESSING, invented by John Hartzell, U.S. Pat. No. 7,078,323, filed Sep. 29, 2004, which is incorporated herein by reference.

BACKGROUND OF THE INVENTION

1. Field of the Invention

This invention generally relates to integrated circuit (IC) and liquid crystal display (LCD) fabrication and, more particularly, to a system and method for laser annealing using a digital light valve gating mechanism.

2. Description of the Related Art

The fabrication of electronic devices such as integrated circuits and thin film transistors requires many process steps, including deposition, etching, annealing, crystallization, and others. Each of these steps requires one or more energy sources applied to the substrate, and/or neighboring material, to complete the process. Many of these processes also require a photolithography step to isolate the area to be processed. Photolithography and masking steps are very costly manufacturing processes.

FIGS. 13A and 13B illustrate, respectively, a conventional laser crystallization lateral growth process and a mask used in support of such a process (prior art). A laser source is conventionally used to crystallize amorphous silicon (a-Si) on temperature sensitive substrates, such as glass or plastic, in the manufacture of LCDs. A mask permits selected areas of Si to be heated to melting, without degrading the underlying substrate. One conventional process, known as Sequential Lateral Solidification (SLS) or Laser-Induced Lateral Growth, uses a mask to sequentially expose adjacent strips of a-Si to laser light, crystallizing the a-Si into polycrystalline Si (poly-Si). The poly-Si is used to fabricate electrical devices, such as TFTs for display applications. Alternately, polysilicon materials can be used in the manufacture of mechanical and photonic devices.

The prior methods for SLS or lateral crystallization use a mask to form the laser beam into beamlets that are directed on the substrate. These beamlets are effectively scanned in a stepping motion across a substrate producing a laterally crystallized polysilicon material. This polysilicon material on substrate is typically used to fabricate TFT array backplanes for display products. There are two major problems with this method. The material electrical properties of transistors, with channels parallel to the scan direction of the laser beam, are of a very high quality. However, the material electrical properties of transistors, with channels running perpendicular to the scan direction of the laser beam, are only approximately 50% of those with channels parallel to the scan direction. Thus, large non-uniformities in the characteristics of thin film transistors that are perpendicular to each other. This non-uniformity results in a low quality display, due to the non-uniformity of discreet pixel TFTs and non-uniformities between TFTs making up circuit elements.

Further, the masks used to form the laser beamlets are expensive and susceptible to damage over time. In addition, a manufacturer may be required to use many masks to process different types of crystallization. For example, masks with different slit widths are used to promote different crystallization results. It is also known to use a sequential series of different masks. Specialized masks combining different slit widths and directions are also used for particular applications. All these specialized masks, in turn, require unique reticles and mask fabrication processes. Thus, for particular crystallization applications, the expenses associated with the initial cost of the masks, and the process steps of changing masks, can be prohibitive.

It would be advantageous if selective areas of Si could be crystallized without using a mask.

It would be advantageous if the selective areas of crystallization could be dynamically modified without making a corresponding change to a mask.

It would be advantageous if laser light could sequentially expose regions of a substrate without the necessity of a mask or photoresist step.

SUMMARY OF THE INVENTION

This application describes to use of a light valve to control the delivery of light to a substrate surface. In combination with a laser or other light source, and a motion control system, the light valve can be used in the fabrication of electronic, mechanical, and/or photonic devices without the necessity of a mask or photolithography. The light source, digital light valve, and motion control system deliver discreet packets of energy to a precise location on a substrate in order to carry out processes that require energy.

A typical example of a process step requiring a localized annealing step requires that a reticle be created; a mask formed from the reticle; the mask be mounted for an annealing process; and, the mask be dismounted after annealing. The invention described herein supports laser annealing processes, while eliminating the need to build, mount, and dismount the mask. The reduced number of process steps and mask fabrication result in huge savings.

Accordingly, a method is provided for crystallizing a semiconductor film using a digital light valve. The method comprises: enabling pixel elements from an array of selectable pixel elements; in response to enabling the pixel elements, gating a light; sequentially exposing adjacent areas of a semiconductor film, such as Si, to the gated light; annealing the light-exposed areas of semiconductor film; and, in response to the annealing, laterally growing crystal grains in the semiconductor film. For example, the method may sequentially expose adjacent areas of the semiconductor film as follows: sequentially exposing adjacent areas of semiconductor film to gated light in a first direction; and, simultaneously exposing adjacent areas of semiconductor film to gated light in a second direction, different than the first direction. For example, the second direction may be perpendicular to the first direction. The simultaneous movement of laser light in different directions cannot occur if a conventional mask is used. As a result, crystal grains can be laterally grown simultaneously in the first and second directions.

More specifically, enabling pixel elements from an array of selectable pixel elements includes: exposing a digital light valve array of selectable pixel elements to the light; enabling a pattern of adjacent pixel elements; and, reflecting light from the pattern of enabled pixel elements. Thus, the sequential exposing of adjacent semiconductor film areas is responsive to a sequence of enabled pixel element patterns.

In another aspect of the method, the semiconductor film is heated to a minimum threshold temperature, for example using a flood light source, such as an excimer lamp, or laser, such as $CO_2$ laser. Then, the semiconductor film is annealed in response to the minimum threshold-heated semiconductor film absorbing the gated light.

Additional details of the above-described method and a digital light valve system for crystallizing semiconductor film are provided below.

BRIEF DESCRIPTION OF THE DRAWINGS

FIG. 4 is a partial cross-sectional view of the digital light valve of FIG. 2, where each pixel element is a mirror that reflects light when enabled.

FIG. 5 is a partial cross-sectional view of the digital light valve of FIG. 2, where pixels pass (transmit) light.

FIG. 14 is a flowchart specifically illustrating a method for crystallizing a semiconductor film in a radial pattern.

FIG. 15 is a flowchart illustrating a method for dynamically crystallizing a semiconductor film.

FIG. 18A through 18D are drawings illustrating the modulation aspect of the light valve crystallization system.

DETAILED DESCRIPTION OF THE PREFERRED EMBODIMENTS

Figure 1:
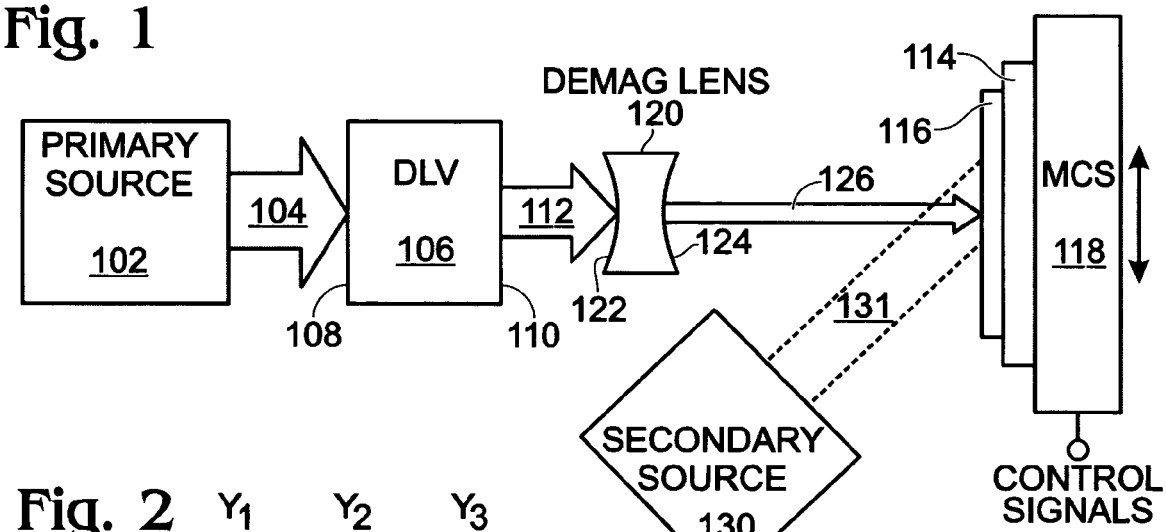
FIG. 1 is a schematic block diagram of a digital light valve system for crystallizing a semiconductor film.

FIG. 1 is a schematic block diagram of a digital light valve system for crystallizing a semiconductor film. The system 100 comprises a primary light source 102 supplying light 104. For example the primary source 102 can be a coherent or substantially coherent laser light source operating at a wavelength of approximately 1 micron or 1000 nanometers (nm) (CO2), 308 nm (XeC), 351 nm (XeF), 248 nm (KrF), 193 nm (ArF), or a 2nd and $3^{rd}$ harmonic (ND:YAG) 533/353 (150-500) nm. Other wavelengths are also possible, and light need not be coherent. Further, the light source 102 need not be a laser. A digital light valve (DLV) 106 has an interface 108 to accept the light and an interface 110 to supply light 112 gated in a sequential pattern. A substrate carrier 114 is provided for mounting a semiconductor film 116, located in the path of the gated light 112. Typically, a motion control subsystem (MCS) 118 is used to control the position light valve 106 with respect to the substrate carrier 114. As shown, the motion control subsystem 118 is shown connected to the substrate carrier 114, to move the carrier 114. Alternately but not shown, the motion control subsystem could be connected to the light valve 106, or to both the light valve and the substrate carrier 114. The crystal grains in the semiconductor film 116 are laterally grown in adjacent regions in response to the gated light sequential pattern (i.e., see FIG. 7).

Figure 2:
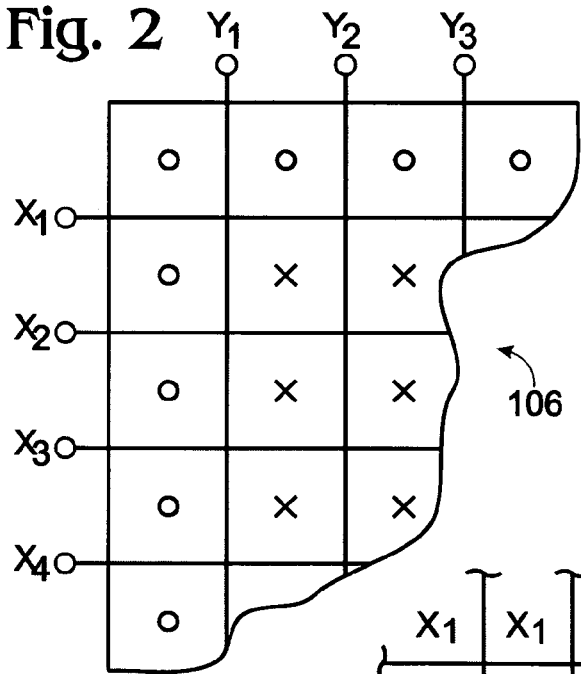
FIG. 2 is a plan view illustrating an exemplary digital light valve.

FIG. 2 is a plan view illustrating an exemplary digital light valve. The light valve includes a plurality of pixels or pixel elements that selectively gate light, either by transmission or reflection. The light valves can be selected using an X-Y matrix of control lines, such as might be used to enable LCD pixels or read/write memory cells. The light valve is called digital in consideration that each pixel can be individually controlled. The digital light valve 106 can take a number of different forms. For example, the digital light value can be enabled using microelectromechanical switch (MEMS) mirror arrays, such as those made by Texas Instruments or Silicon Light Machines. The mirror and array sizes, switching speeds, and tolerable light fluence levels make these commercially available light valves candidates for this process scheme. The "X" marking represents enabled pixel elements, while the "O" markings represent pixels that are not enabled. The pixel elements are shown as square, however, they may also be rectangular, circular, or oval in shape. The pixel elements are not limited to any particular shape. In one aspect, the length (or width, or diameter) of each pixel element can be in the range of 1 to 200 microns.

Figure 3:
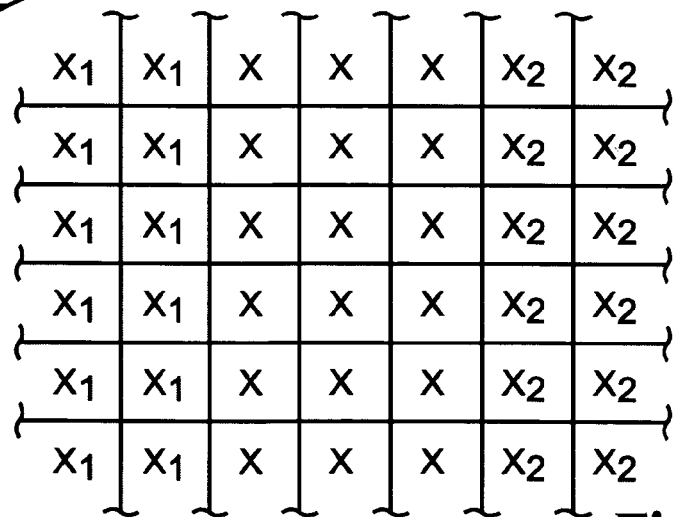
FIG. 3 is digital light valve of FIG. 2, showing a sequence of enabled pixel elements.

FIG. 3 is digital light valve of FIG. 2, showing a sequence of enabled pixel elements. The "X1" markings represent pixels enabled in a first sequence, the "X2" markings represent pixels enabled in a second sequence, and the "X" markings represent pixels enabled in both the first and second sequence. Such a sequence might be used when the lateral growth associated with a laser shot, or series of laser shots, is significantly longer than the length of a single pixel element. The enable/disable switching speed can as great as 20 megahertz, which is more than sufficient to support a typically laser shot repetition rate in the range of 0.1 to 500 kilohertz.

For example, the pixel elements may be 15 microns sq, and the lateral growth lateral growth length in the semiconductor film is 80 to 100 microns. Then, a 5 (length) by 10 (width) pixel area is radiated every laser shot, with shift of 2 pixels in the length direction (approximately half the growth length) every shot, assuming a demagnification lens is not being used. Note, only a 6-pixel width area is shown in the figure.

In one aspect, two or more pixel enablement sequences are performed in the course of a single laser shot. That is, a plurality of sequences can be enabled during a single laser shot. For example, the pixel elements in a region can be modulated on and off at a particular frequency. In another example, a "wave" or "ripple" type of sequence pattern can be created. The system is not limited to any particular type of sequence pattern. Further, the sequence need not necessarily use on/off (0/100%) enabled pixel elements, but rather a gray scale of transmission values in a range between 0 and 100%. For example, a single pixel element can be enabled for a three-step sequence of 0, 50%, and 100% transmission.

Figure 18A:
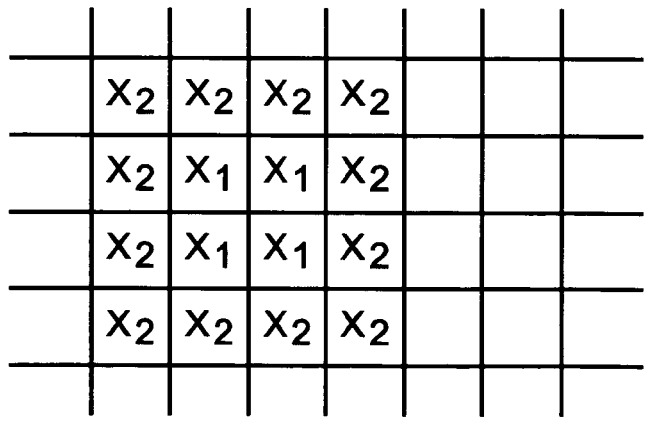

FIG. 18A through 18D are drawings illustrating the modulation aspect of the light valve crystallization system. As described above, pixels can be activated in sequences. The sequences can be moving in different directions. Further, the enablement of pixel elements in the activated sequence can be modulated. In some aspects, the pixel enablement duration is modulated. For example, the sequence may enable the center pixels longer than the pixels along the outside edges. As shown in FIG. 18A, center pixels X1 are enabled for a longer duration than pixels X2. FIG. 18B shows the next laser shot in the sequence. The entire sequence, including the longer duration (X1) pixels, has shifted 2 pixels to the right. Alternately, the pixels in a sequence may be enabled for a longer duration over just a certain area of film that is thicker than the surrounding areas, made from a different semiconductor material, or that requires a higher grade of crystalline, or other mechanical quality, due to the nature of the circuit that is be fabricated in that area.

The modulation may differentiate by position in the sequence. As shown in FIGS. 18C and 18D, the sequence may move to the right, with the leading edge shaped as an arrow. Further, the modulation may differentiate by the transmission characteristics of enabled pixels in the activated sequence. Returning to FIGS. 18A and 18B, the pixels in the center (X1) of the sequence may be enabled with a higher-energy fluence, for example, as a result of controlling the transmission characteristics of the enabled pixels.

FIG. 4 is a partial cross-sectional view of the digital light valve of FIG. 2, where each pixel element is a mirror that reflects light when enabled. In one aspect, an enabled pixel element is the default condition, where enabled pixels are parallely aligned. For example, the enabled pixel elements may be aligned parallel to the light valve surface. Then, a pixel element is disabled by moving the pixel alignment away from a surface-parallel alignment. For example, a pixel can be disabled by causing incident light to reflect a predetermined angle different from the light reflected by enabled pixel elements. That is, the disabled pixel elements diffract incident light by being angled from a normal default enable position. Alternately, the pixels are enabled by moving the pixel alignment a predetermined angle from the DLV surface. Note, the positioning of the DLV and DLV surface may be important in the gating of light from enabled pixels.

FIG. 5 is a partial cross-sectional view of the digital light valve of FIG. 2, where pixels pass (transmit) light. As an alternate to mirrors, the light valve can operate by passing or transmitting light through selected pixel regions 200, instead of reflecting it. In another aspect, the light valve can block light through selected pixels 202 (transmission is the default condition). In another variation, the pixel element 204 is a film that transmits or attenuates incident light in response to an electrical or chemical stimulus. For example, the transmission characteristics of the film itself can be controlled. As shown, pixel 204a is passing light, while pixel 204b is attenuating incident light. Alternately, the film transmission characteristics of pixel 206 can be controlled by deforming the film surface, or otherwise controlling the angle at which incident light hits the film surface. Pixel 206b is blocking incident light, while pixel 206b is passing it. In another variation (see pixel 208), the transmission (attenuation) characteristics need not necessarily be binary (on/off). That is, a gray scale or graduated transmission of light may be supplied at a number of discrete levels between 0 and 100%. For example, a pixel element may be selectively enabled to transmit incident light at 0, 33, 50, 67, 80, or 100%.

Figure 6:
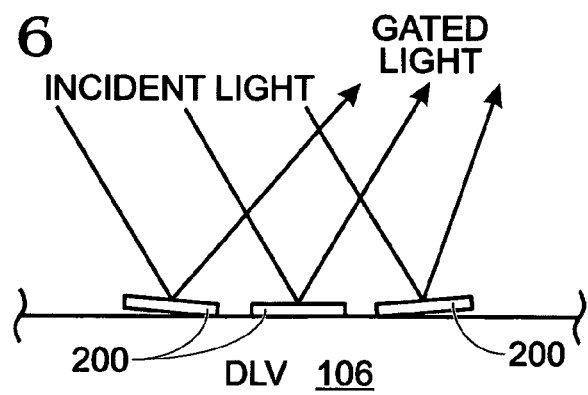
FIG. 6 is a partial cross-sectional view of the digital light valve of FIG. 2, where the pixel elements are mirrors that can be focused.

FIG. 6 is a partial cross-sectional view of the digital light valve of FIG. 2, where the pixel elements 200 are mirrors that can be focused. As an another alternative, instead of a on/off mirror array, a mirror array can be used that focuses light, so that the gated light on one particular film area may be the combination of a number of mirrors (pixels) angled to focus on the particular film area. Such a gating arrangement enables mirror pixel elements to transmit incident light in a gray scale of values. Note, if the pixel surfaces or distances between pixels are large with respect to the light wavelength, care must be taken with phase relationship between the combined gated light paths.

Returning to FIG. 1, in one aspect of the system 100 a demagnification lens 120 has an input 122 to accept the gated light 108 from the digital light valve 106 and an output 124 to supply demagnified gated light 126 to the substrate carrier 114. Advantageously, this aspect of demagnification lens 120 reduces the heat load on the light valve, concentrating the gated output on a reduced area of semiconductor film. Alternately but not shown, the demagnification lens input 122 accepts light 104 from the primary light source 102 and its output 124 supplies demagnified gated light to the digital light valve 106. Advantageously, this aspect of the demagnification lens 120 treats a larger area of semiconductor film than the other demagnification lens arrangement.

In some aspects, a secondary light source 130, such as a flood light source, such as an excimer lamp, or a laser, such as a CO2 laser, supplies light 131 to the substrate carrier 114. The secondary light source 130 permits the semiconductor film 116 to be heated to a minimum temperature. As a result of secondary heating, the process threshold temperature can be achieved with a lower heat load on the light valve, or the gated light energy can be distributed across a larger region of semiconductor film.

Figure 7:
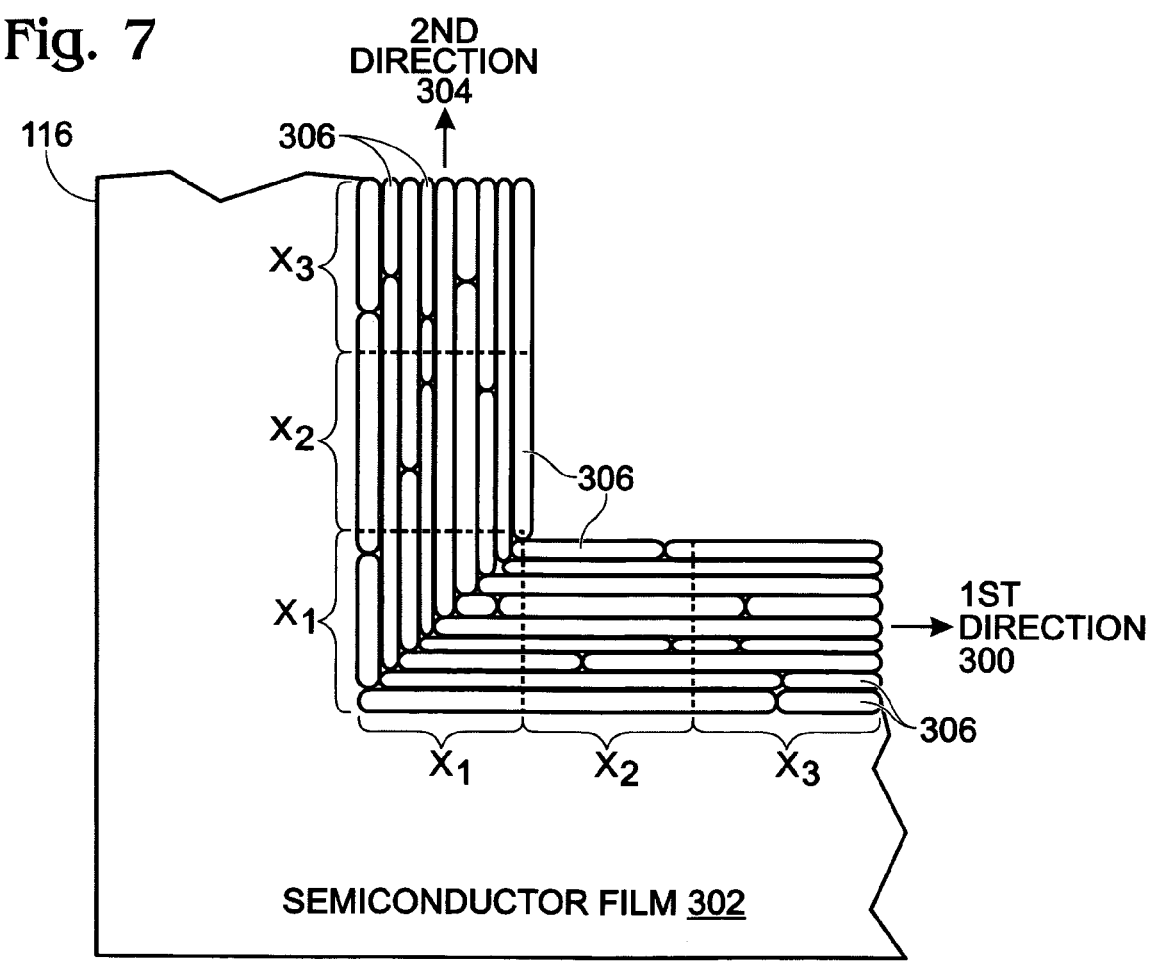
FIG. 7 is a plan view of the semiconductor film surface of FIG. 1 illustrating an exemplary gated light sequence.

FIG. 7 is a plan view of the semiconductor film surface of FIG. 1 illustrating an exemplary gated light sequence. As shown, the digital light valve supplies light gated in a first direction 300 along a surface 302 of the semiconductor film 116. Simultaneously, gated light is supplied in a second direction 304, different than the first direction 300, along the surface 302 of the semiconductor film 116. The sequence moves with each laser shot. Laser shots X1, X2, and X3 are shown. The first and second directions are shown as orthogonal, but they need not necessarily be so. The laser shots are shown as originating from a common region (X1), but they need not be so (see FIG. 10 for example). As a result, crystal grains 306 in the semiconductor film 116 are laterally grown simultaneously in the first direction 300 and second direction 304.

Figure 8:
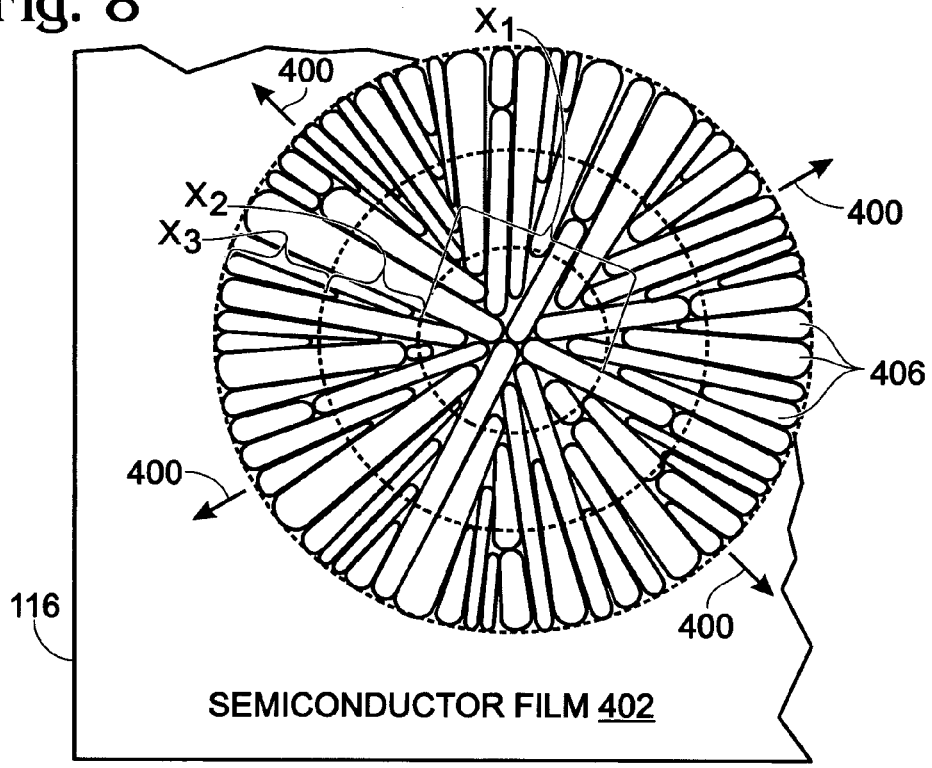
FIG. 8 is a plan view of the semiconductor film surface of FIG. 1 illustrating another exemplary gated light sequence.

FIG. 8 is a plan view of the semiconductor film surface of FIG. 1 illustrating another exemplary gated light sequence. Here, the digital light valve supplies light gated in an outwardly radial pattern 400 on a surface 402 of the semiconductor film 116. That is, the direction 400 is outward from a center point 404. Thus, crystal grains 406 in the semiconductor film 116 are laterally grown in the outwardly radial pattern 400. The dotted lines represent the outward boundaries of 3 laser shots; X1, X2, and X3.

Functional Description

Figure 9:
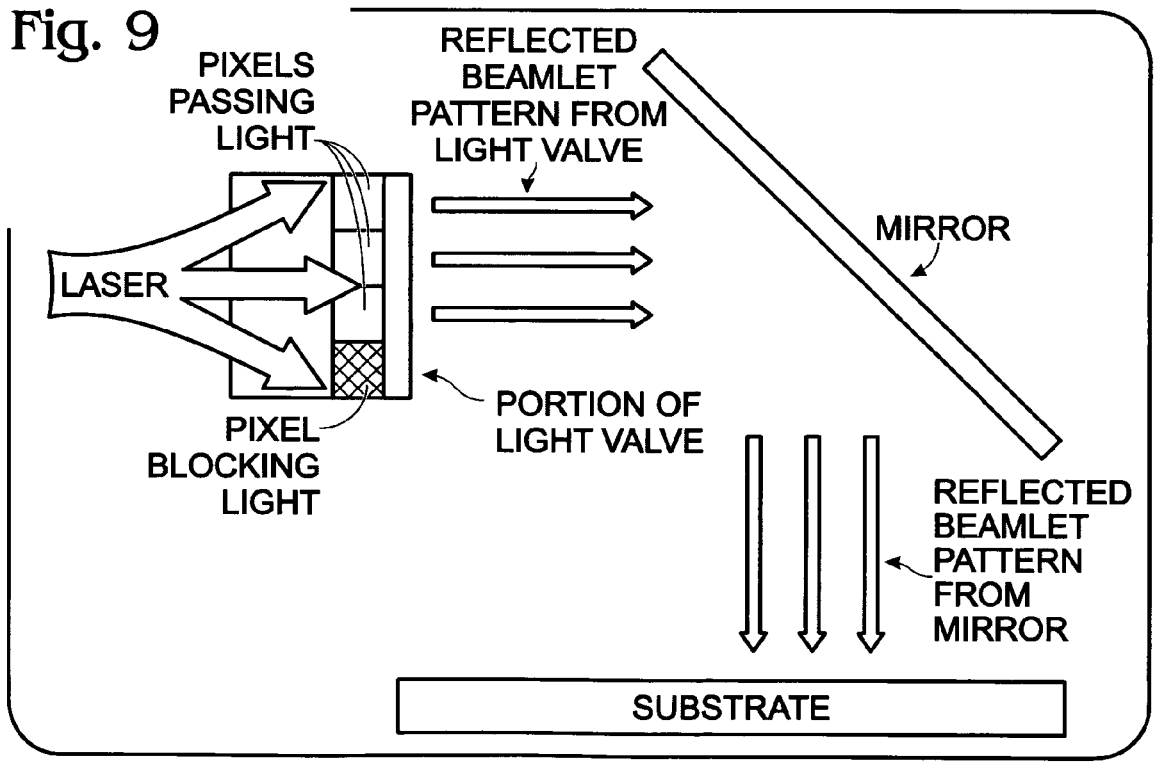
FIG. 9 is a schematic block diagram illustrating another aspect of the light valve crystallization system.

FIG. 9 is a schematic block diagram illustrating another aspect of the light valve crystallization system. The use of the above-described light valve crystallization system eliminates masking requirements for crystallization processes, while permitting the simultaneous processing of perpendicular TFTs with uniform high-quality characteristics. The light valve eliminates the need for photolithography or a mask during some device fabrication processing steps. The basic idea is to direct a laser, or other high intensity light beam, through appropriate optical elements and into a light valve. The light valve breaks the laser beam up into digitally controlled optical "pixel" elements in a grid formation. The beam exits the light valve and may be directed through additional optical elements, which may include a projection lens to demagnify the beam image.

The advantage of the demagnification step is twofold: 1) reduction of the energy density of the beam in the light-valve, which might damage the light-valve, by magnifying the resulting energy fluence at the process substrate; and 2) increasing the resolution of the image on the process substrate. Once the beam "pixel elements" exit the light value, they strike the substrate in a pattern appropriate for the process being carried out.

Since the individual pixel elements can be controlled by the driving circuitry of the light valve, the elements can either pass light or block light. The process substrate is mounted on a stage or substrate carrier, which accurately controls motion in one or more directions, and can be maneuvered in front of the light valve. In this fashion, a computer-controlled system can accurately control the delivery of discrete packets of light energy to selected areas of the process substrate. This process allows the user to carry out "localized" thermal, chemical, and photonic reactions on the process substrate.

This invention eliminates or reduces the need for photolithography or masking steps during processing. Possible process steps that can use this invention include crystallization, deposition, etch (ablation), anneal, and dopant activation. One of the important aspects of this invention has to with delivering the energy necessary to carry out the desired process. In the case of the annealing of amorphous silicon into polysilicon, the reaction is a "threshold" type of reaction. That is: the melting and crystallization of the a-Si takes place above a threshold temperature. Below this temperature, the reaction either does not take place, or the time necessary to carry out the process is much longer. In the case of the crystallization of a-Si into polysilicon, the melt temperature of a-Si is around 1500° C. and the laser crystallized film must reach this temperature to complete this process in the typical, very short, timeframe, in the tens of nanoseconds. The crystallization process can take place at a lower temperature, however, if the Si is not melted. A sub-melting temperature solid phase crystallization (SPC) requires a process time on the order of hours. To reach the required temperature for laser-annealed polysilicon, a very high dose of laser energy is required. If this high energy, or high laser fluence, is passed directly through the light valve, it might damage the light valve.

Therefore, in one aspect the area being annealed is exposed to two energy sources. A secondary source (flood source) heats the desired process area to, or below the threshold temperature. The primary source controlled by the digital light valve (primary source) supplies the remaining energy necessary to exceed the threshold temperature only in the desired process areas. This flood source may take many forms and may flood the entire substrate within the irradiation area, or it may be directed by a beam reduction scheme, such as a mask, into discreet areas. The primary source, directed through the light valve, supplies additional energy to selected areas. These selected areas are taken above the threshold temperature and the crystallization of the a-Si by the melting process takes place. Thus, the digital light valve can precisely control where the process is carried out. Note, the use of the terms "primary" and "secondary" is arbitrary.

One process that benefits from the present invention concept is the laser crystallization of amorphous silicon into polycrystalline or single-crystal silicon. Lateral grain growth of the polycrystalline material is a method that yields a high quality material. The lateral growth concept, enabled with masks, is already known. This invention utilizes a digital light valve array to achieve lateral growth instead of a mask. As previously mentioned, one of the problems with the SLS process is the relationship between "directional dependence" and the quality of the grains. The directional dependence of the material electrical quality results in a large uniformity difference in TFT characteristics between devices whose channel is parallel to the scan direction, versus devices with channels perpendicular to the scan direction.

Figure 10:
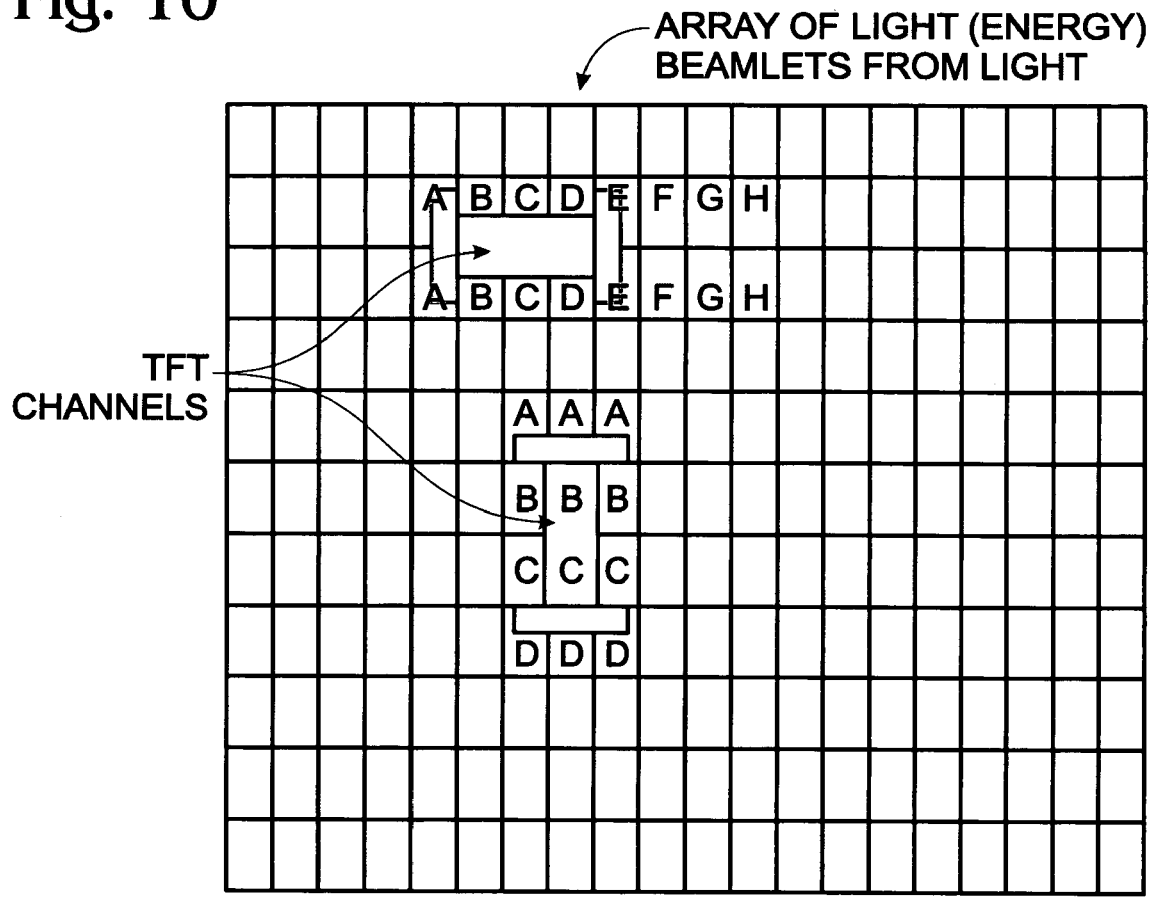
FIG. 10 is a plan view of a semiconductor film surface illustrating perpendicular lateral growth directions.

FIG. 10 is a plan view of a semiconductor film surface illustrating perpendicular lateral growth directions. The present invention system and method enables the SLS process, while circumventing the directional dependence issue. The digital light valve array can sequentially activate pixels in any direction and achieve lateral growth in multiple directions at once, thus eliminating the directional dependence of the process. Shown are two TFT's whose channels are oriented perpendicular to each other. In this scheme, the process pixels are activated to allow beamlets of laser energy in the following sequence:

1) Pixels labeled A, B, and C;
2) Pixels labeled B, C, and D;
3) Pixels labeled C, D, and E; and,
4) Pixels labeled D, E, and F.

In this way, the sequential growth scan direction occurs in two different directions, and the two TFTs shown are both made from high-quality polysilicon material, and so equal in performance, without a directional dependence.

Typically, the lateral growth of the crystallization process from one irradiation (one laser pulse) exceeds the length of one process pixel (the length of the exposed area). This condition is commonly understood to support continuous lateral growth. In the boundary condition, the above analysis assumes lateral growth in a single direction using a minimum of one rectangular pixel. If a single process pixel is used to support lateral growth in a particular direction, then the lateral growth in that direction must exceed the length of the pixel. Alternately, the lateral growth in one direction, in response to a single laser shot, may exceed the combined length of a plurality of adjacent pixels.

One other advantage of this method is that selective crystallization of the substrate can be performed, to crystallize only the required areas. This method is applied to the display manufacturing process quite efficiently. The mask design that is used to layout the various thin films in the TFT process can be utilized to develop a program to control the laser tool to irradiate only the areas requiring polysilicon.

Figure 11A:
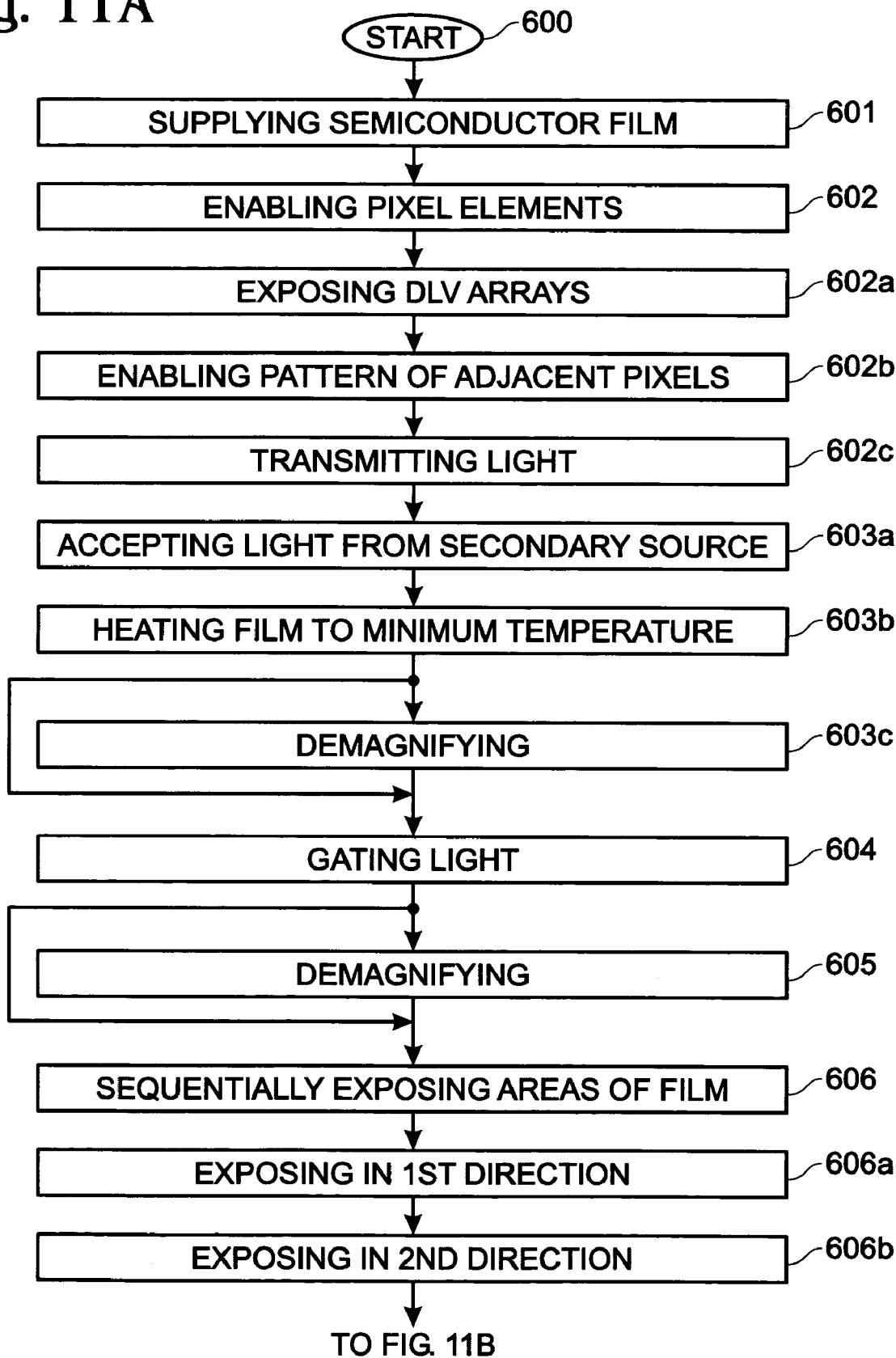
FIGS. 11A and 11B are flowcharts illustrating a method for crystallizing a semiconductor film using a digital light valve.
Figure 11B:
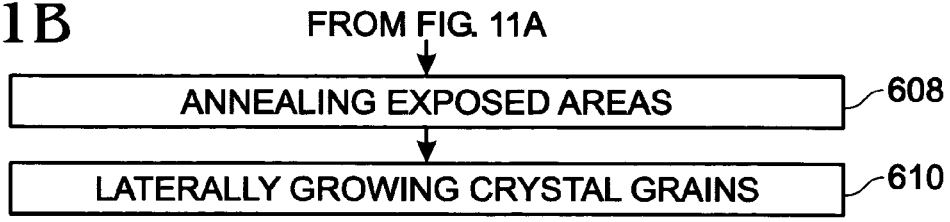
Figure 13A:
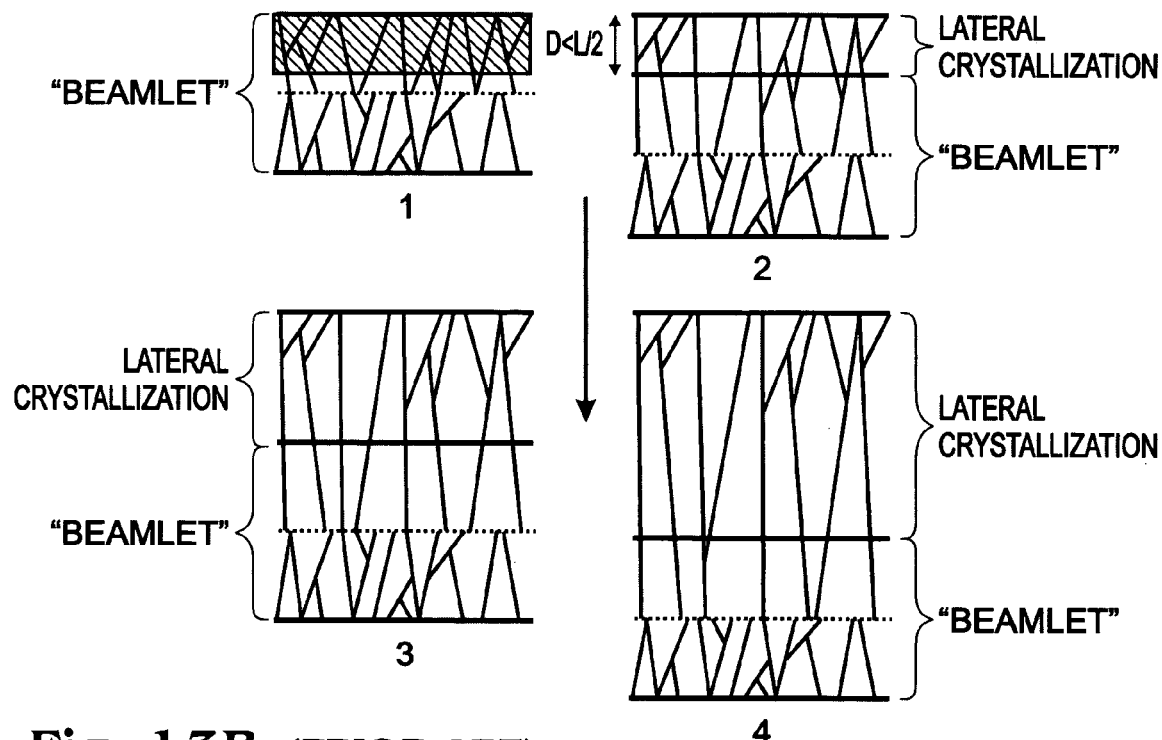
FIGS. 13A and 13B illustrate, respectively, a conventional laser crystallization lateral growth process and a mask used in support of such a process (prior art).
Figure 13B:
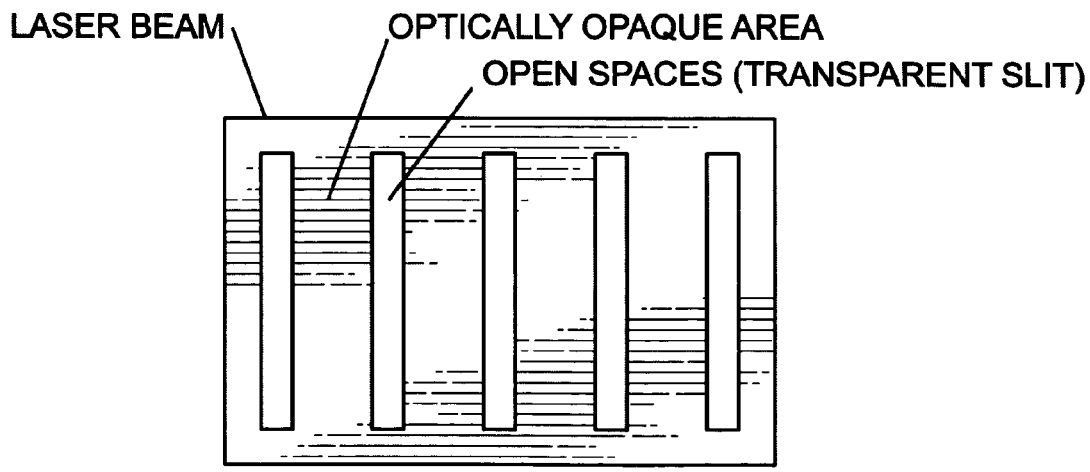

FIGS. 11A and 11B are flowcharts illustrating a method for crystallizing a semiconductor film using a digital light valve. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 enables pixel elements from an array of selectable pixel elements. Step 604 gates a light in response to enabling the pixel elements. For example the light can be a coherent or substantially coherent laser light source operating at a wavelength of approximately 1 micron or 1000 nanometers (nm) ($CO_2$), 308 nm (XeC), 351 nm (XeF), 248 nm (KrF), 193 nm (ArF), or a 2nd and $3^{rd}$ harmonic (ND:YAG) 533/353 (150-500) nm. Typically then, Step 604 gates light having a wavelength in the range between 150 and 500 nanometers, although other wavelengths are also possible, and light need not be coherent. Further, the light source need not be a laser. Step 606 sequentially exposes adjacent areas of a semiconductor film to the gated light. Step 608 anneals the light-exposed areas of semiconductor film. Step 610, in response to the annealing, laterally grows crystal grains in the semiconductor film.

In one aspect, Step 602 activates a sequence of enabled pixel element patterns and Step 606 sequentially exposes areas in response to the sequence of enabled pixel element patterns. In another aspect, sequentially exposing adjacent areas of the semiconductor film in Step 606 includes substeps. Step 606a sequentially exposes adjacent areas of semiconductor film to gated light in a first direction. Step 606b simultaneously exposes adjacent areas of semiconductor film to gated light in a second direction, different than the first direction. For example, the second direction may be orthogonal to the first direction. However, the method is not limited to any particular relationship between directions. Then, Step 610 laterally grows crystal grains simultaneously in the first and second directions.

In another aspect, enabling pixel elements from an array of selectable pixel elements in Step 602 includes substeps. Step 602a exposes a digital light valve array of selectable pixel elements to the light. Step 602b enables a pattern of adjacent pixel elements. Step 602c transmits light from the pattern of enabled pixel elements. As noted earlier, the light transmission may be controlled through reflection, non-reflection, passing through, and attenuation. Alternately, Step 602c may transmit or pass light through the pattern of enabled pixel elements. In another alternative Step 602c blocks or attenuates light through the pattern of enabled pixel elements.

Optionally, an additional step (Step 603b) heats the semiconductor film to a minimum threshold temperature in response to accepting light from a secondary light source. For example, the minimum threshold temperature may be less than 1400 degree C., which may be useful when crystallizing Si films. Then, Step 610 anneals, at least partially, in response to the minimum threshold-heated semiconductor film absorbing the gated light. For example, Step 603a accepts light from a secondary, flood light source, and Step 603b heats the semiconductor film to a minimum threshold temperature in response to the flood light source. The flood source can be an excimer lamp or laser for example.

In one aspect, Step 603c, demagnifies the light, prior to it being gated in Step 604. In a different aspect, Step 605, subsequent to gating the light, demagnifies the gated light.

In a different aspect, Step 601 supplies a semiconductor film overlying a transparent substrate. The semiconductor film may be silicon-germanium, amorphous Si, microcrystalline Si, or nanocrystalline Si. In one particular aspect, Step 601 provides a substrate, a SiO2 base coat overlying the substrate, and a Si film overlying the base coat. The substrate may be a transparent temperature-sensitive material such as quartz, plastic, or glass. Step 606 exposes adjacent areas of the Si film to the gated light. Step 603a accepts light from a secondary light source, such as a CO2 laser. Then, heating the semiconductor film to a minimum threshold temperature (Step 603b) includes heating the Si film as follows: heating the SiO2 base coat in response to absorbing the light from the CO2 laser; and, the Si film receiving heat conducted from the SiO2 base coat.

For example, considering both FIGS. 11 and 3, activating a sequence of enabled pixel element patterns (Step 602) includes: enabling pixel elements having a width; and, sequencing the enabled pixel element pattern in a first direction. Then, Step 610 laterally grows the crystal grains in the first direction with a lateral growth length greater than the pixel width. For example, the enabled pixel elements may have a width in the range of 1 to 200 microns.

Sequencing the enabled pixel element pattern in the first direction may be further described as: defining an array of enabled pixel elements having a first area with a first width and a first length (see FIG. 3); enabling a first array of pixel elements; and, subsequently enabling a second array of pixel elements, shifted at least 1 pixel width in the first direction from the first array. Using FIG. 3 as an example, the array shown has a width of 6 pixels and a length of 5 pixels. The first array is associated with the X1 enablement, and the second array is associated with the X2 enablement. The second array is shifted 2 pixels from the first array. Then, Step 610 includes the substeps of: crystallizing a first region of semiconductor film having the first area, in response to the first array of enabled pixel elements (see FIG. 7); and, crystallizing a second region of semiconductor film having the first area, at least one pixel-width in the first direction from the first area, in response to the second array of enabled pixel elements.

Figure 12:
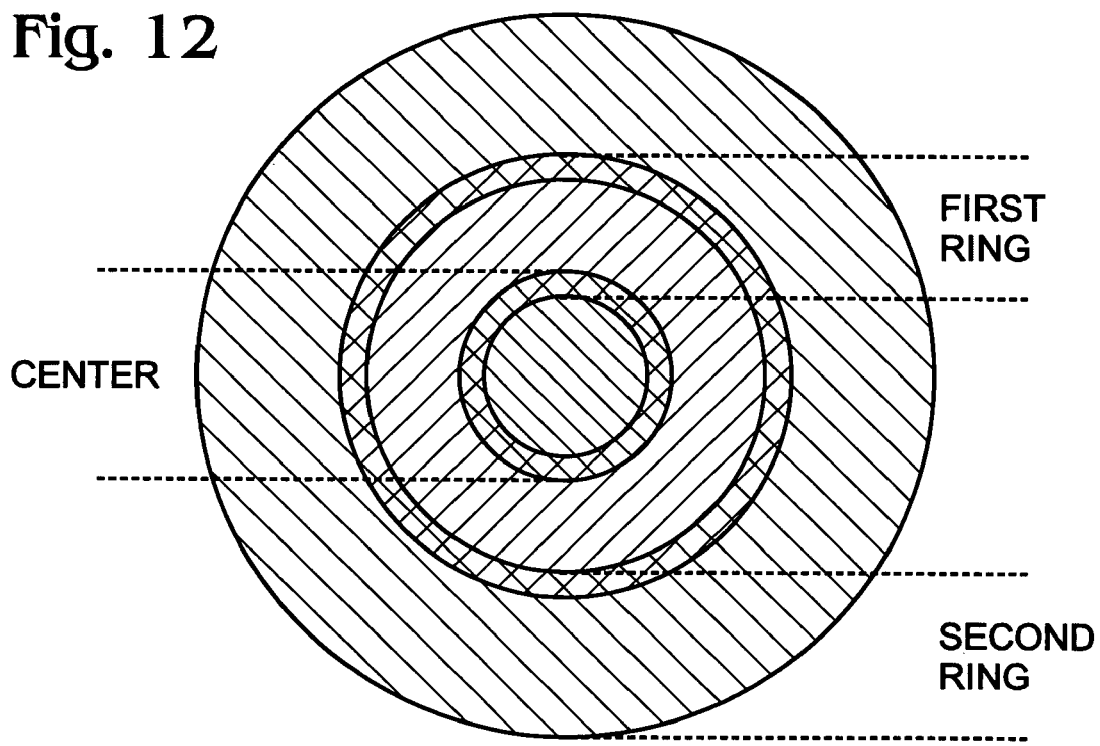
FIG. 12 is a plan view of a digital light valve illustrating an outwardly radial pixel enabling sequence.

FIG. 12 is a plan view of a digital light valve illustrating an outwardly radial pixel enabling sequence. Considering FIGS. 11 and 12, in one aspect activating a sequence of enabled pixel element patterns in Step 602 includes sequencing the enabled pixel elements radially outward from a center. More specifically, sequencing the enabled pixel elements radially outward from a center includes: enabling a center group of pixel elements defined by a perimeters; subsequently enabling a first ring of pixel elements having an inside circumference, inside the circle perimeter, and an outside circumference, outside the circle perimeter. Note, the center group perimeter and ring need not have the same shape, although they are both depicted as circular. Further, the center perimeter and ring shapes need not be circular. For example, either one, or both of the center perimeter and ring shapes may be square or rectangular.

Considering FIGS. 8, 11, and 12, laterally growing crystal grains in the semiconductor film (Step 610) includes: crystallizing a center area of semiconductor film (see X1, FIG. 8) in response to the enabled center group of pixels; and, growing crystal grains radially outward from the center area in response to the enabled pixel elements of the first ring.

Figure 16A:
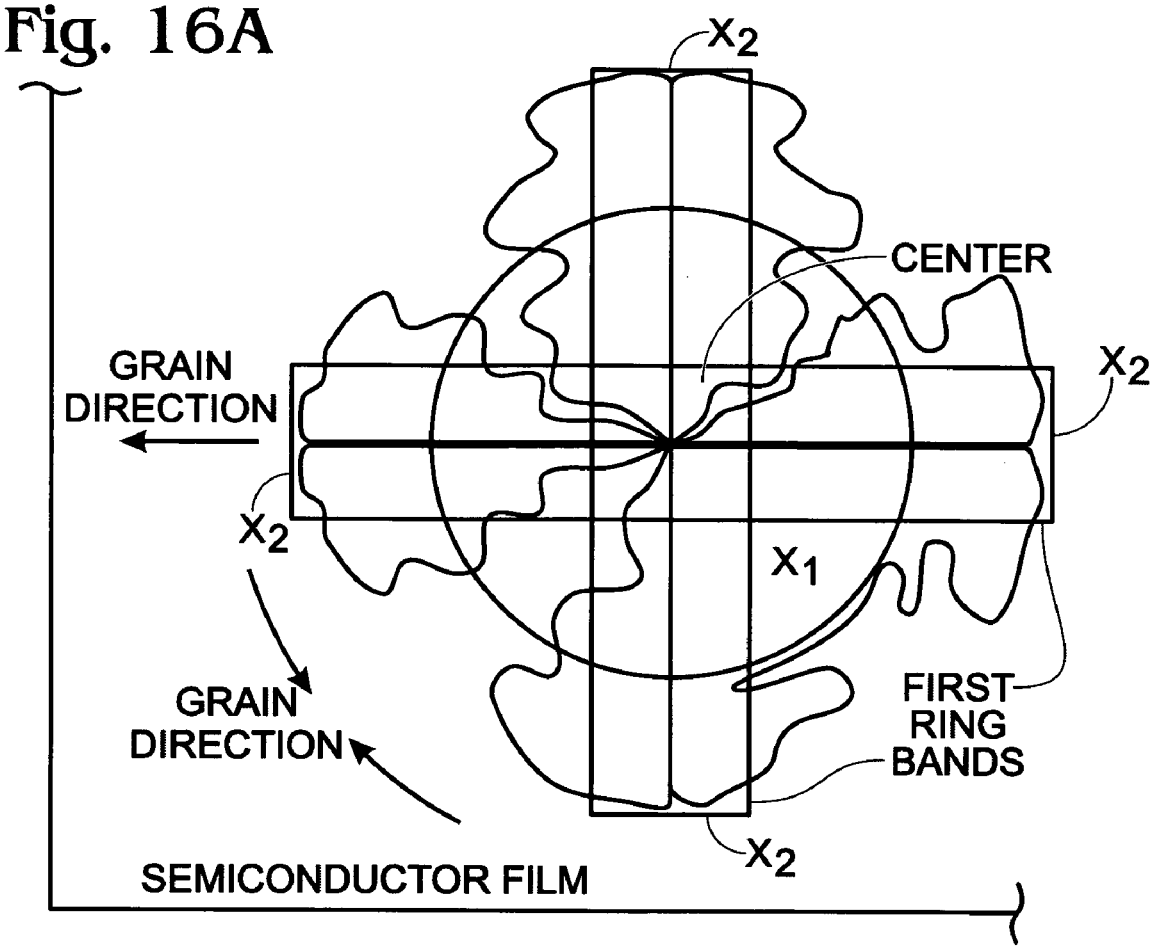
FIGS. 16A and 16B are diagrams illustrating another aspect of outwardly radial lateral crystallization.
Figure 16B:
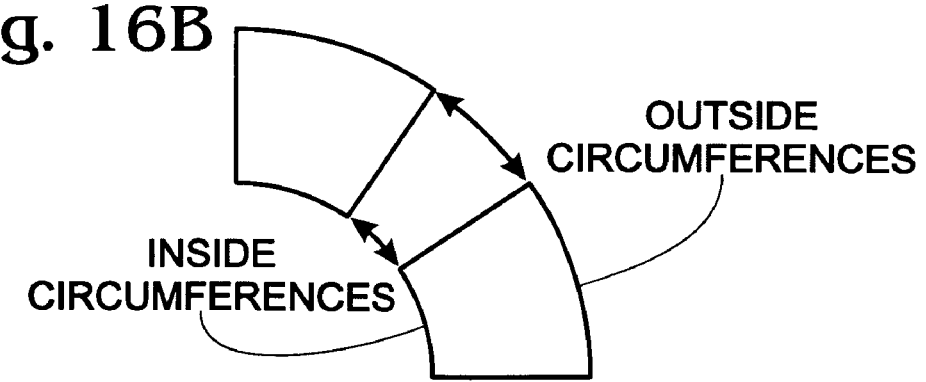

FIGS. 16A and 16B are diagrams illustrating another aspect of outwardly radial lateral crystallization. More specifically, subsequently enabling a ring of pixel elements having inside and outside circumferences in Step 602 includes enabling bands of pixel elements in the first ring (see FIG. 16A). Then, growing crystal grains radially outward from the center area in response to the enabled pixel elements of the first ring (Step 610) includes: growing crystal grains radially outward in bands from the center area in response to the enabled bands of pixel elements of the first ring; and, laterally growing crystal grains between the bands (see X2, FIG. 16A). The method is not limited to any particular number of bands, band shapes, or distances between bands. In some aspects (see FIG. 16B), the inside circumference of each band is less than the outside circumference, so that distance between bands at the inside circumference point is the same as at the outside circumference point.

Optionally, Step 602 subsequently enables a second ring of pixel elements having an inside circumference, inside the first ring outside circumference, and an outside circumference, outside the ring outside circumference. Likewise, Step 610 grows crystal grains radially outward from the first ring area towards a second ring area (see X3, FIG. 8) in response to the enabled pixel elements of the second ring. Although a two and three-ring pixel enablement sequences have been described, it should be understood that the outwardly radial sequence can be repeated any number of times (rings). Further, the outwardly radial sequence may employ other sequences inside (simultaneous with) the radial sequence, or gray scale pixel enablement.

FIG. 14 is a flowchart specifically illustrating a method for crystallizing a semiconductor film in a radial pattern. The method starts at Step 700. Step 702 sequentially enables pixel elements in an outwardly radial pattern. Step 704 gates a light in response to enabling the pixel elements. Step 706 sequentially exposes adjacent areas of a semiconductor film to the gated light. Step 708 anneals the light-exposed areas of semiconductor film. Step 710 laterally grows outwardly radial crystal grains in the semiconductor film in response to the annealing.

FIG. 15 is a flowchart illustrating a method for dynamically crystallizing a semiconductor film. The method begins a Step 800. Step 802 locates an initial crystalline (i.e. poly or single-crystal) region in a semiconductor film. The location may be predetermined or discovered by examination of the film. Step 803a determines a crystalline (i.e., single or polycrystalline) target area in the semiconductor film. For example, the target area might be the channel region of an LCD driver TFT. Step 804 enables pixel elements from an array of selectable pixel elements. Step 806 gates a light in response to enabling the pixel elements. Step 808 sequentially exposes areas of a semiconductor film, adjacent the initial crystalline region, to the gated light. Step 810 anneals the light-exposed areas of semiconductor film. Step 812 laterally grows crystal grains in the semiconductor film from the initial crystalline region in response to the annealing.

In one aspect, sequentially exposing areas of a semiconductor film, adjacent the initial crystalline region, (Step 808) includes substeps. Step 808a sequentially exposes adjacent areas of semiconductor film to gated light in a first direction. Step 808b simultaneously exposes adjacent areas of semiconductor film to gated light in a second direction, different than the first direction. Then, laterally growing crystal grains in the semiconductor film (Step 812) includes laterally growing crystal grains simultaneously in the first and second directions. Alternately, Step 808 may gate light in more than two directions simultaneously, or gate in a radial pattern.

In another aspect, Step 803b calculates a path between the initial crystalline region and the crystalline target area. Then, Step 808 sequentially exposes adjacent areas of semiconductor film, to gated light, along the calculated path.

In a different aspect, Step 801a initially anneals the semiconductor film, and Step 801b creates the initial crystalline region in response to the initial annealing. Thus, locating the initial crystalline region (Step 802) and laterally growing crystal grains in the semiconductor film from the initial crystalline region (Step 812) includes laterally growing crystal grains from the initial crystalline area in a single process, continuous from the initial annealing.

Alternately stated, the method may begin with a semiconductor film that includes crystalline regions (sources) formed in a previous process. If the single-crystal areas have been precisely placed for example, then the location can be considered predetermined. If predetermined, then the annealing process may also follow a predetermined plan, since the source and target are both known before the process begins. If the previously formed single crystal region is not precisely placed, or the initial single-crystal region is formed in situ, as part of the lateral growth process, then the process may be dynamic. That is, since the source is not predetermined, the lateral growth path must be determined and performed on-the-fly, different for each region of a semiconductor film, and different for each substrate in general.

Figure 17:
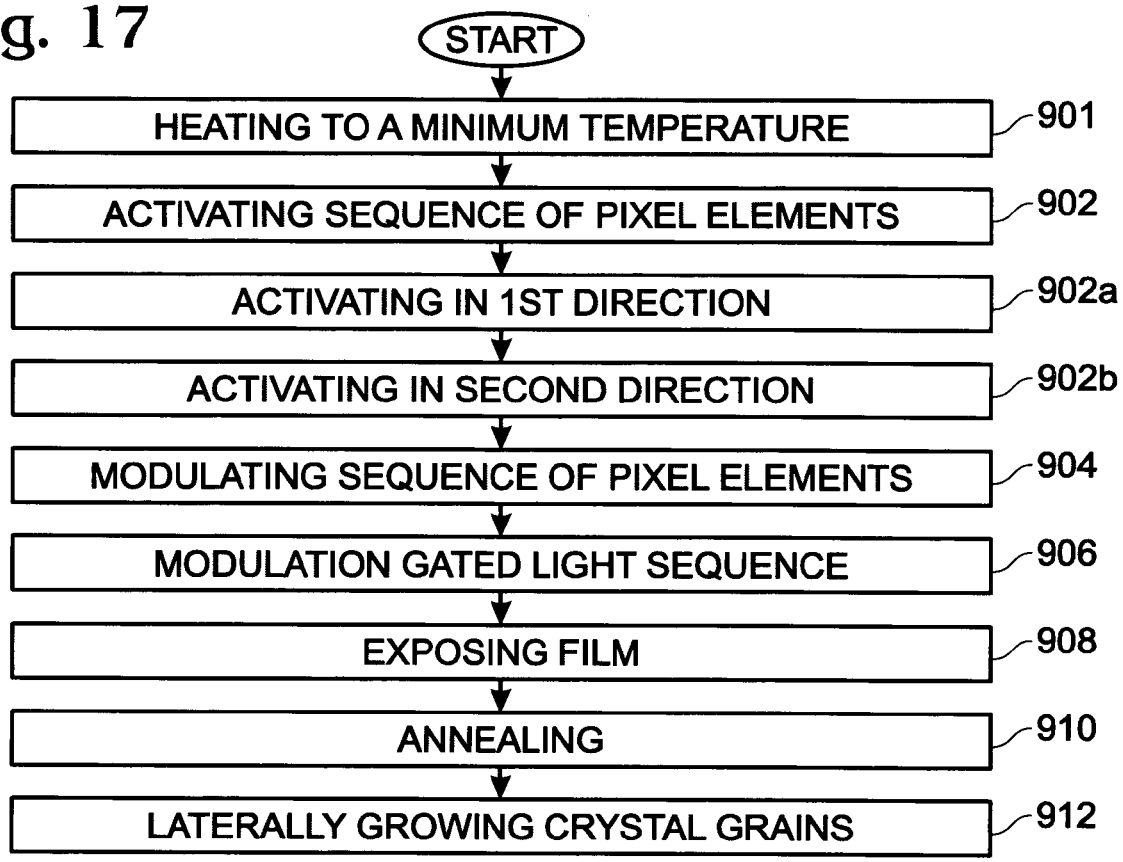
FIG. 17 is a flowchart illustrating an alternate aspect of the method for crystallizing a semiconductor film using a digital light valve.

FIG. 17 is a flowchart illustrating an alternate aspect of the method for crystallizing a semiconductor film using a digital light valve. The method starts at Step 900. Step 902 activates a sequence of pixel elements. Step 904 modulates the enablement of pixel elements in the activated sequence. Step 906 modulates a gated light sequence. That is, the light is gated in response to the activated sequence of pixel elements, and modulated in response to the activated sequence being modulated. Step 908 exposes adjacent areas of a semiconductor film to the modulated gated light sequence. Step 910 anneals the light-exposed areas of semiconductor film. Step 912 laterally grows crystal grains in the semiconductor film.

In some aspects, modulating the enablement of pixel elements in the activated sequence (Step 904) includes differentiating the duration. For example, the sequence may include enabling the center pixels longer than the pixels along the outside edges. Alternately, all the pixels in a sequence may be enabled for a longer duration of a certain area of film that is thicker than surrounding areas, made from a different semiconductor material, or requiring a higher grade of crystalline quality due to the nature of the circuit that is be fabricated in that area. The modulation may differentiate by position in the sequence. For example, the sequence may move in a first direction, with the leading edge shaped as an arrow. Thus, enablement in the sequence is determined with respect to the leading edge of the sequence. Further, the modulation may differentiate by the transmission characteristics of enabled pixels in the activated sequence. For example, the pixels in the center of the sequence may be enabled with a higher-energy fluence, either as a result of controlling the transmission characteristics of the enabled pixels, or through focusing the energy of adjoined mirrored pixel elements.

In one aspect, activating a sequence of pixel elements Step 902 includes substeps. Step 902a sequentially activates pixel elements in a first direction. Step 902b simultaneously, sequentially activates pixel elements in a second direction, different than the first direction. Then, laterally growing crystal grains (Step 912) includes laterally growing crystal grains simultaneously in the first and second directions.

In another aspect, Step 901 heats the semiconductor film to a minimum threshold temperature, using a flood light or laser source for example. Then, annealing in Step 910 includes annealing in response to the minimum threshold-heated semiconductor film absorbing the gated light.

A system and method for semiconductor film crystallization has been presented using a digital light valve. A few examples of pixel elements and enablement patterns have been given to illustrate the invention. However, the invention is not limited to merely these examples. Further, although the described uses of the digital light valve have large been limited to crystallization processes, it should be understood that the invention is applicable to other IC and LCD processes that conventionally use heat, in combination with either photoresist or a laser mask.

A typical example of a process step requiring a photolithographic step is as follows: clean substrate; TFT process, such as conformal depositing a material as a result of heating the substrate in a deposition atmosphere; photoresist coat; exposure in a stepper or exposure tool; curing of the photoresist; development of the photoresist; etching of the deposited material; ashing of the photoresist; stripping of the photo resist; and, clean step. The invention described herein reduces these ten steps down to two: clean substrate; and, localized deposition in a deposition atmosphere using a light valve-gated laser beam. Thus, it should be understood that the invention can be used to support localized chemical or mechanical processes. Other variation and embodiments of the invention will be understood by those skilled in the art.

I claim:

1. A digital light valve system for crystallizing a semiconductor film, the system comprising:
   a primary light source supplying light;
   a digital light valve having an interface to accept the light from the primary light source and an interface to supply light gated in a sequential pattern, the digital light valve including a plurality of pixel elements, where each pixel element is selectively enabled to rate incident light;

a substrate carrier for mounting a semiconductor film, located in the path of the gated light;

a motion control subsystem controlling the gated light path; and, wherein crystal grains in the semiconductor film are laterally grown in adjacent regions in response to the gated light sequential pattern.

2. The system of claim 1 further comprising:

a demagnification lens having an input to accept the gated light from the digital light valve and an output to supply demagnified gated light to the substrate carrier.

3. The system of claim 1 further comprising:

a demagnification lens having an input to accept light from the primary light source and an output to supply demagnified gated light to the digital light valve.

4. The system of claim 1 further comprising:

a secondary light source to supply light to the substrate carrier, for the purpose of heating the semiconductor film to a minimum temperature.

5. The system of claim 4 wherein the secondary light source is selected from the group including a flood light and a laser.

6. The system of claim 1 wherein the digital light valve supplies light gated in a first direction along a surface of the semiconductor film, and simultaneously in a second direction, different than the first direction, along the surface of the semiconductor film.

7. The system of claim 6 wherein crystal grains in the semiconductor film are laterally grown simultaneously in the first and second directions.

8. The system of claim 1 wherein the digital light valve supplies light gated in an outwardly radial pattern on a surface of the semiconductor film.

9. The system of claim 8 wherein crystal grains in the semiconductor film are laterally grown in the outwardly radial pattern.

10. The system of claim 1 wherein the digital light valve transmits gated light.

11. The system of claim 1 wherein the digital light valve reflects gated light.

* * * * *

UNITED STATES PATENT AND TRADEMARK OFFICE
CERTIFICATE OF CORRECTION

PATENT NO. : 7,682,948 B2  
APPLICATION NO. : 11/483431  
DATED : March 23, 2010  
INVENTOR(S) : John Hartzell It is certified that error appears in the above-identified patent and that said Letters Patent is hereby corrected as shown below:

In claim 1, column 13, line 3, the word --gate-- has been incorrectly printed as "rate".

Claim 1, column 12, lines 63-67 and column 13, lines 1-10 should be as follows:

1. A digital light valve system for crystallizing a semiconductor film, the system comprising:
a primary light source supplying light;
a digital light valve having an interface to accept the light from the primary light source and an interface to supply light gated in a sequential pattern, the digital light valve including a plurality of pixel elements, where each pixel element is selectively enabled to gate incident light;
a substrate carrier for mounting a semiconductor film, located in the path of the gated light;
a motion control subsystem controlling the gated light path; and,
wherein crystal grains in the semiconductor film are laterally grown in adjacent regions in response to the gated light sequential pattern.

Signed and Sealed this

Fourth Day of May, 2010

David J. Kappos
*Director of the United States Patent and Trademark Office*